United States Patent
Lee et al.

(10) Patent No.: US 7,316,978 B2
(45) Date of Patent: Jan. 8, 2008

(54) METHOD FOR FORMING RECESSES

(75) Inventors: Pei-Ing Lee, Changhua County (TW); Chung-Yuan Lee, Taoyuan (TW); Chien-Li Cheng, Hsinchu (TW)

(73) Assignee: Nanya Technology Corporation, Taoyuan (TW)

( * ) Notice: Subject to any disclaimer, the term of this patent is extended or adjusted under 35 U.S.C. 154(b) by 268 days.

(21) Appl. No.: 11/195,294

(22) Filed: Aug. 2, 2005

(65) Prior Publication Data
US 2007/0032038 A1    Feb. 8, 2007

(51) Int. Cl.
*H01L 21/311* (2006.01)

(52) U.S. Cl. ............ 438/703; 438/700; 438/705; 438/944; 438/947; 257/E21.039

(58) Field of Classification Search ............ 438/525, 438/696, 700, 944, 705
See application file for complete search history.

(56) References Cited

U.S. PATENT DOCUMENTS

| | | | | |
|---|---|---|---|---|
| 6,130,134 A * | 10/2000 | Chen | ............ | 438/302 |
| 6,498,061 B2 * | 12/2002 | Divakaruni et al. | ........ | 438/243 |
| 6,576,558 B1 * | 6/2003 | Lin et al. | ............ | 438/700 |
| 6,589,844 B2 * | 7/2003 | Tanigami | ............ | 438/261 |
| 6,724,035 B2 * | 4/2004 | Fujio et al. | ............ | 257/314 |
| 6,780,730 B2 * | 8/2004 | Lin | ............ | 438/424 |
| 6,802,719 B2 * | 10/2004 | Finney | ............ | 438/270 |
| 6,846,744 B1 * | 1/2005 | Chen | ............ | 438/700 |
| 7,179,748 B1 * | 2/2007 | Lee et al. | ............ | 438/703 |
| 2002/0048913 A1 * | 4/2002 | Finney | ............ | 438/524 |
| 2004/0002203 A1 * | 1/2004 | Deshpande et al. | ......... | 438/525 |
| 2005/0067648 A1 * | 3/2005 | Hung et al. | ............ | 257/301 |
| 2005/0077563 A1 * | 4/2005 | Alsmeier | ............ | 257/301 |
| 2005/0191807 A1 * | 9/2005 | Yang | ............ | 438/248 |
| 2006/0003560 A1 * | 1/2006 | Regul et al. | ............ | 438/520 |
| 2006/0220093 A1 * | 10/2006 | Van Schaijk et al. | ....... | 257/315 |

* cited by examiner

*Primary Examiner*—George R. Fourson
*Assistant Examiner*—John M. Parker
(74) *Attorney, Agent, or Firm*—Quintero Law Office

(57) ABSTRACT

A method for forming a recess. The method includes providing a substrate with two protrusions having a first side wall and a second side wall opposite to the first side wall disposed above the substrate, conformally forming a mask layer on the substrate and the protrusions, tilt implanting the mask layer using a first implanting mask adjacent to the first side wall of the protrusions, removing implanted portions of the mask layer to form a patterned mask layer, and etching the substrate using the patterned mask layer, thereby forming a recess.

20 Claims, 7 Drawing Sheets

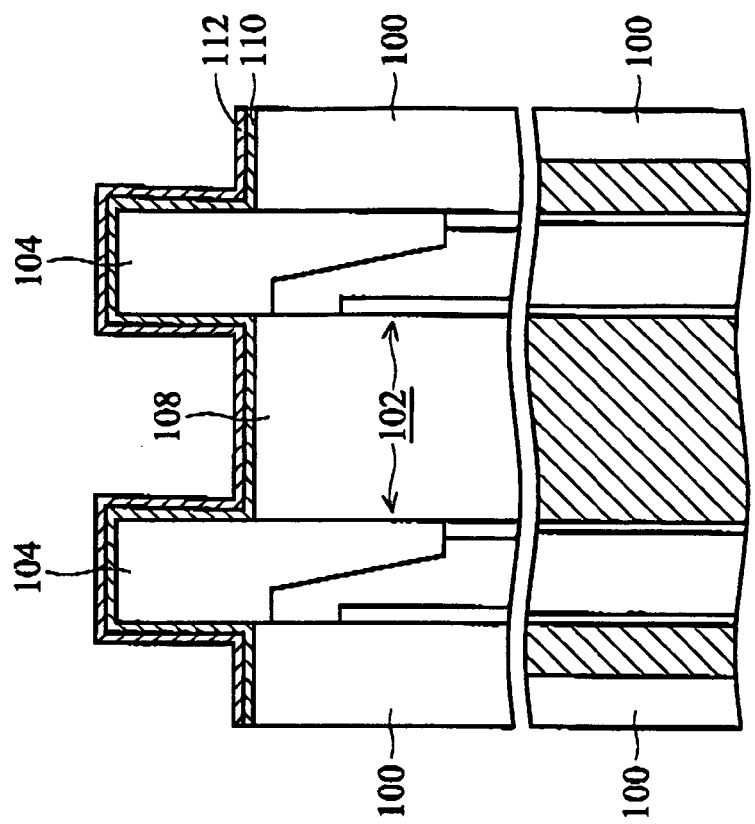
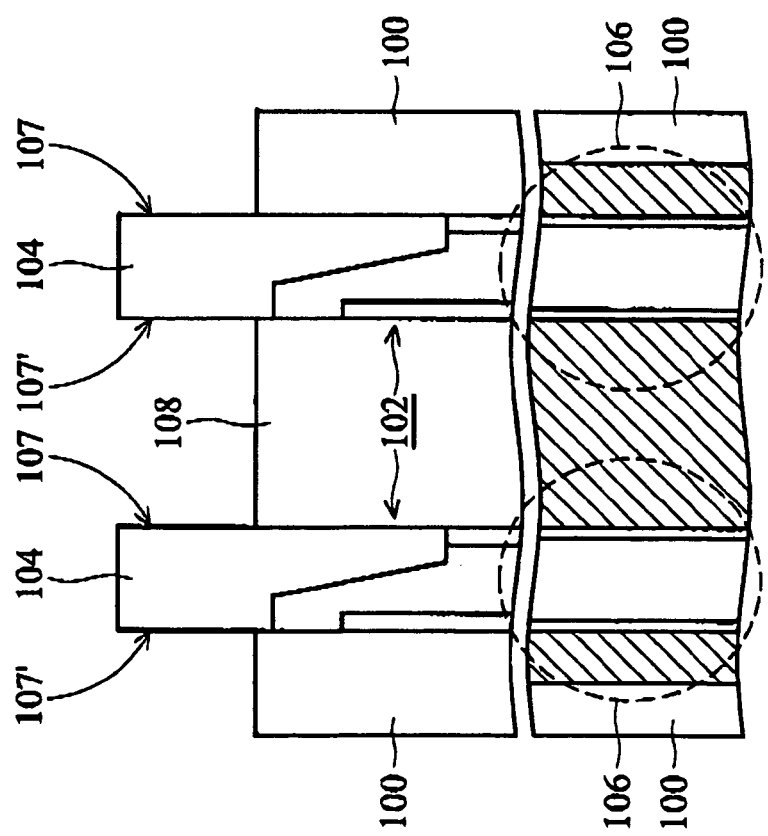
FIG. 2A
FIG. 2B

METHOD FOR FORMING RECESSES

BACKGROUND

The present invention relates to a method for forming a semiconductor structure, and more specifically to a method for forming a recess.

Recently, as fabrication techniques for semiconductor integrated circuits have developed, the number of elements in a chip has increased. Element size has decreased as integration density has increased. For example, the area of memory cells in a memory must be continuously reduced to support a larger number of memory cells, thereby increasing density. Conventional planar transistors such as metal oxide semiconductor field effect transistors (MOSFETs), however, occupy a large amount of surface area on a chip, substantially reducing the available area thereon.

Since the scalability of planar transistors in memory devices is severely limited, memory cells have looked toward utilization of vertical transistors. Vertical transistors are promising candidates for scalability, especially below minimum feature sizes of 100 nm.

Typically, as shown in FIG. 1, a memory cell with a vertical transistor requires forming a recess between two trench capacitors. The recess is defined by photolithography methods. As the feature size shrinks to 100 nm below, however, it is difficult to preciously control the location of the recess. In photolithography, a misaligned recess pattern may likely be formed on the photoresist layer due to overlay errors during exposure, causing a serious alignment shift among such as a recessed gate, an active area, deep trenches, and a bit line contact and deteriorating the yield of fabrication. This issue, however, may get more and more serious while DRAM dimension shrinking.

Thus, it is necessary to develop a method providing a precise alignment control among semiconductor elements, in particular, the distances between a recessed gate and deep trenches.

SUMMARY

The invention provides a method for forming a recess. A substrate with two protrusions disposed above the substrate is provided. Each protrusion has a first side wall and a second side wall opposite to the first side wall. A mask layer is conformally formed on the substrate and the protrusions. The mask layer is then tilt-implanted using a first implanting mask adjacent to the first side wall of the protrusions. The mask layer is then tilt-implanted again using a second implanting mask adjacent to the second side wall of the protrusions. Implanted portions of the mask layer are removed to form a patterned mask layer. The substrate is etched using the patterned mask layer to form a recess.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2A~2K are cross sections of the method for forming a recess of the invention.

DETAILED DESCRIPTION

Figure 1:
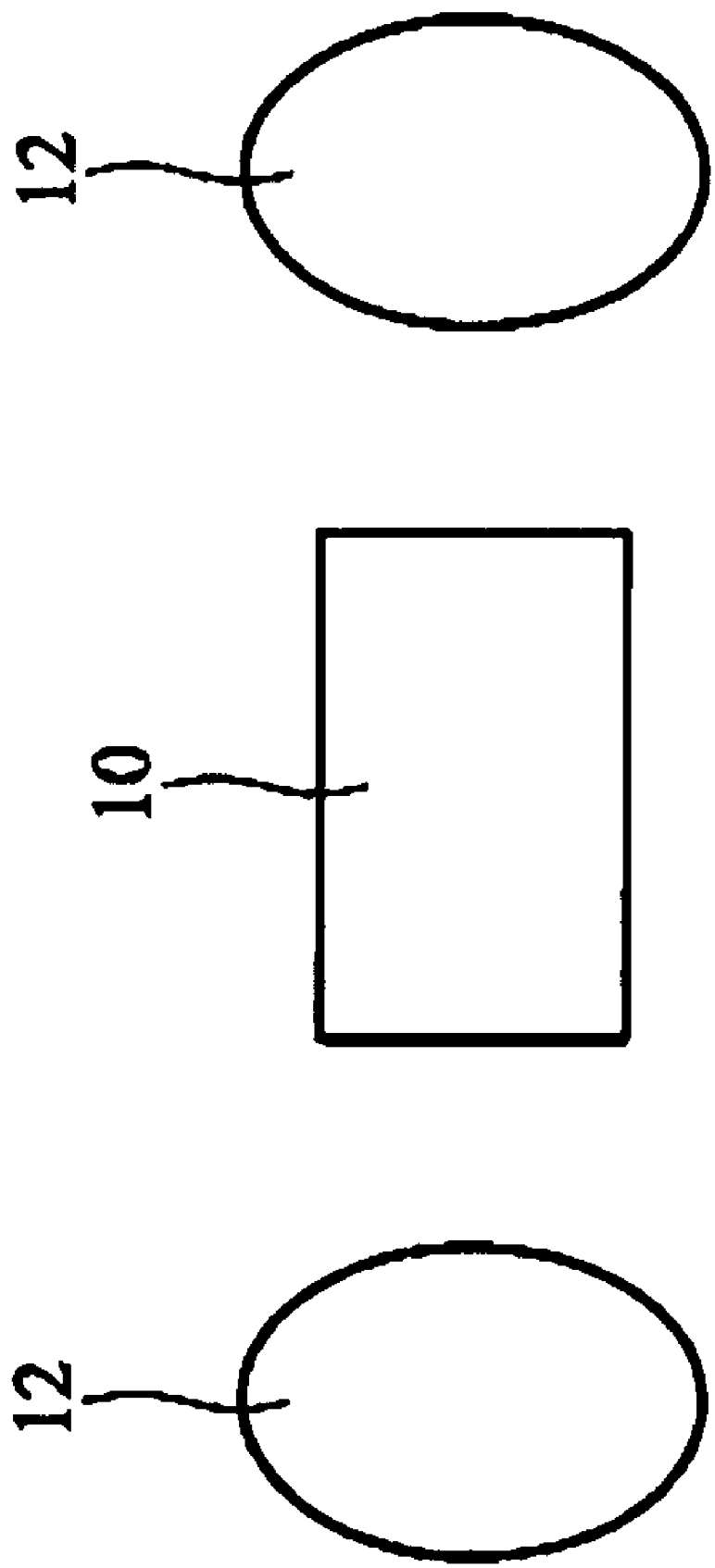
FIG. 1 is a top view of a conventional recess structure.

FIGS. 2A~2K illustrate cross sections of the method for forming a recess according to the invention.

Referring to FIG. 2A, a substrate 100 with two trench capacitor devices 102 protruding above the substrate 100 is provided. The substrate 100 may comprise P-type, N-type, or epitaxy silicon. The trench capacitor device 102 includes a protrusion structure 104 such as a single side buried strap isolation overlying a trench capacitor 106. Each protrusion structure 104 has a first side wall 107 and a second side wall 107' opposite to the first side wall 107. Also, a predetermined area 108 is defined between the two trench capacitor devices 102.

Referring to FIG. 2B, a first mask layer 110 is conformally formed on the substrate 100 and the trench capacitor devices 102. The first mask layer 110 comprises silicon oxide, silicon nitride, or silicon oxynitride, preferably silicon nitride. The second mask layer 112 is then conformally formed on the first mask layer 110. The second mask layer 112 is a material different from the first mask layer 110 and is preferably a silicon oxide layer.

Figure 2C:
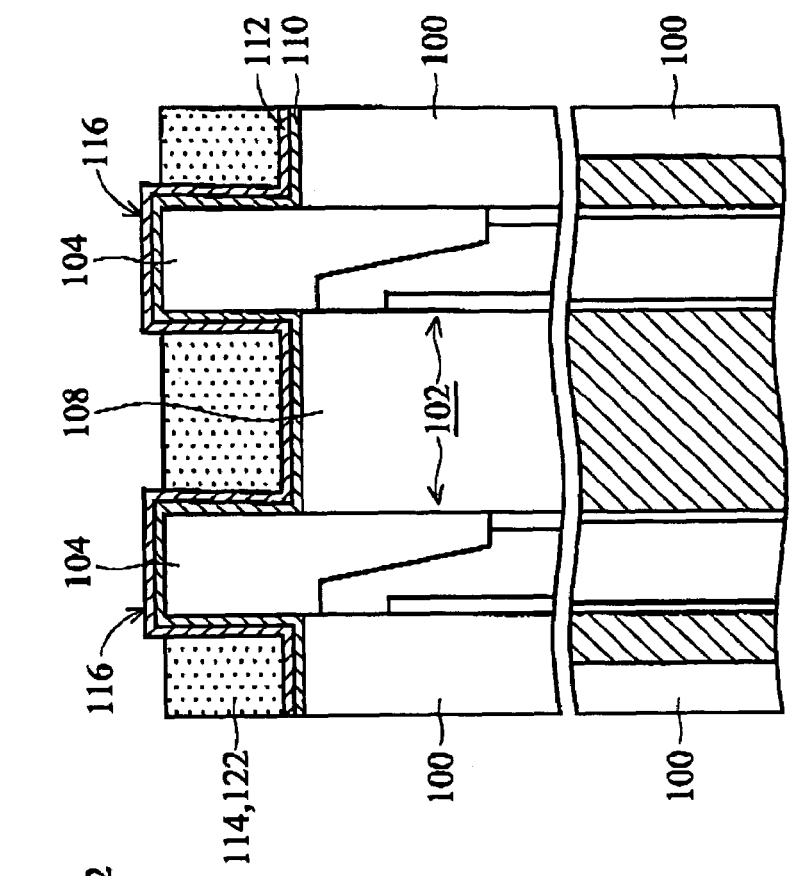
Figure 2D:
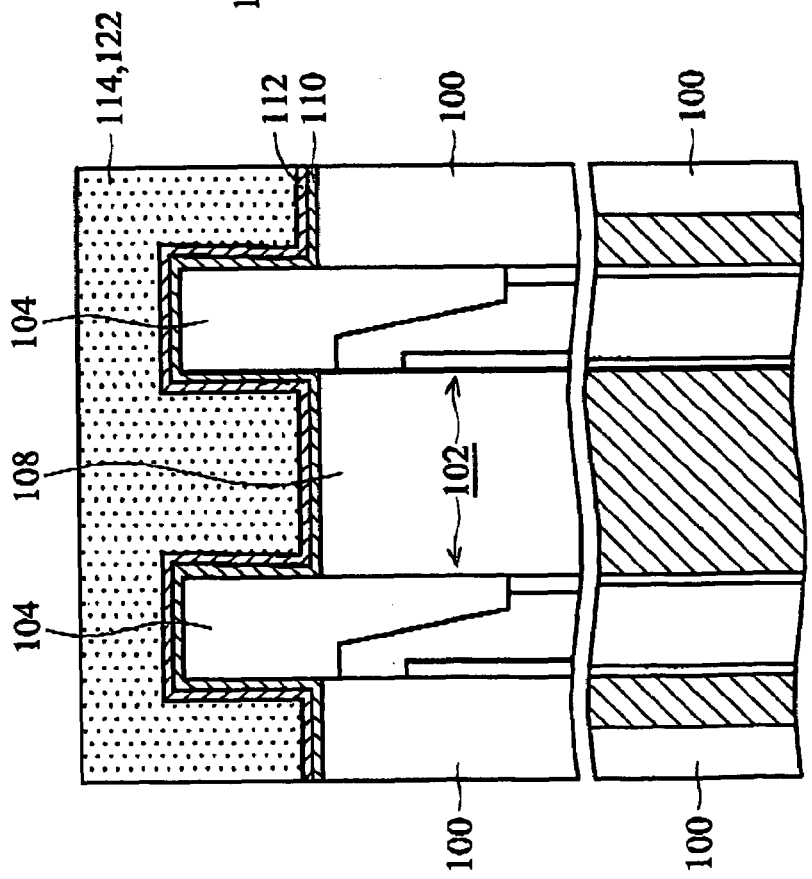

Referring to FIG. 2C, a first photoresist layer 114 is formed over the substrate 100 and the trench capacitor devices 102. The first photoresist layer 114 is then recessed to level with or below top surfaces 116 of the trench capacitor devices 102, as shown in FIG. 2D. The recess may be accomplished by plasma ashing, such as $O_3$ or $O_2$ ashing.

Figure 2F:
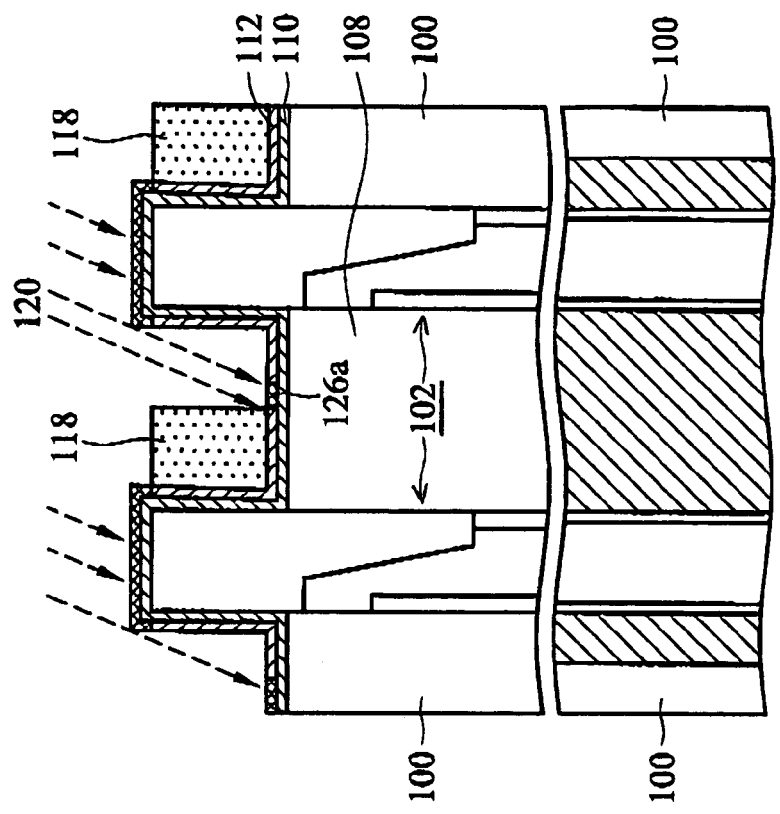
Figure 2E:
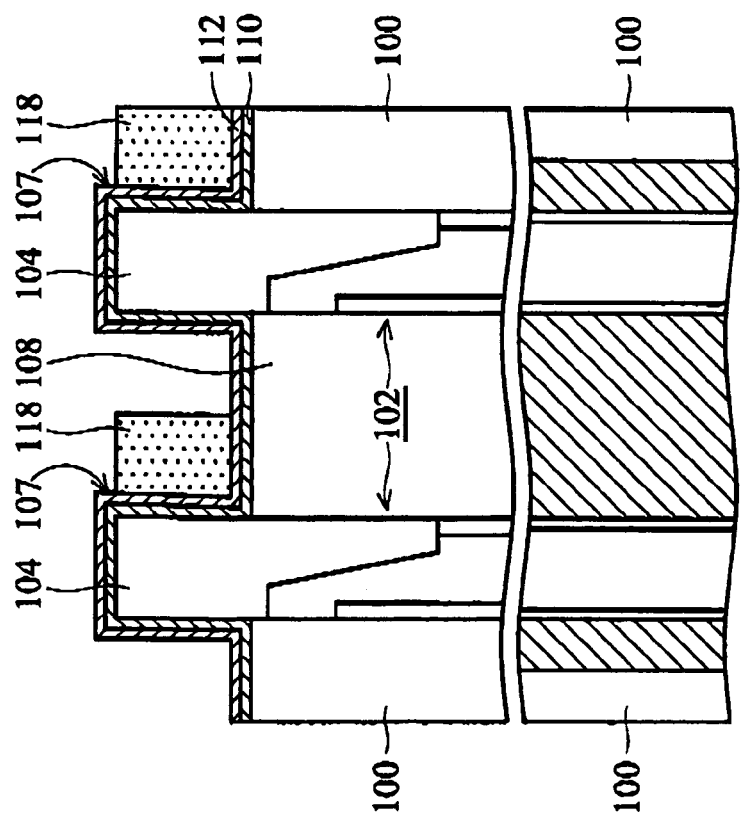

Referring to FIG. 2E, the first photoresist layer 114 is patterned to form a first implanting mask 118. The first implanting mask 118 is adjacent to the first side wall 107 of the protrusion structure 104, that is, on one side of the predetermined area 108.

Referring to FIG. 2F, a portion of the second mask layer 112 is tilt-implanted 120 with, such as $BF_2$, using the first implanting mask 118. A first implanted portion 126a is formed above a predetermined recess area. The first implanted portion 126a is used to define the recess location, which can be preciously controlled by the height of the protrusion structure 104 and the tilt-implanted angle.

Alternatively, another tilt-implanting process is performed. A second photoresist layer 122 is formed over the substrate 100 and the trench capacitor devices 102 and recessed to level with or below top surfaces 116 of the trench capacitor devices 102 by the similar processes, as shown in FIGS. 2C and 2D.

Figure 2H:
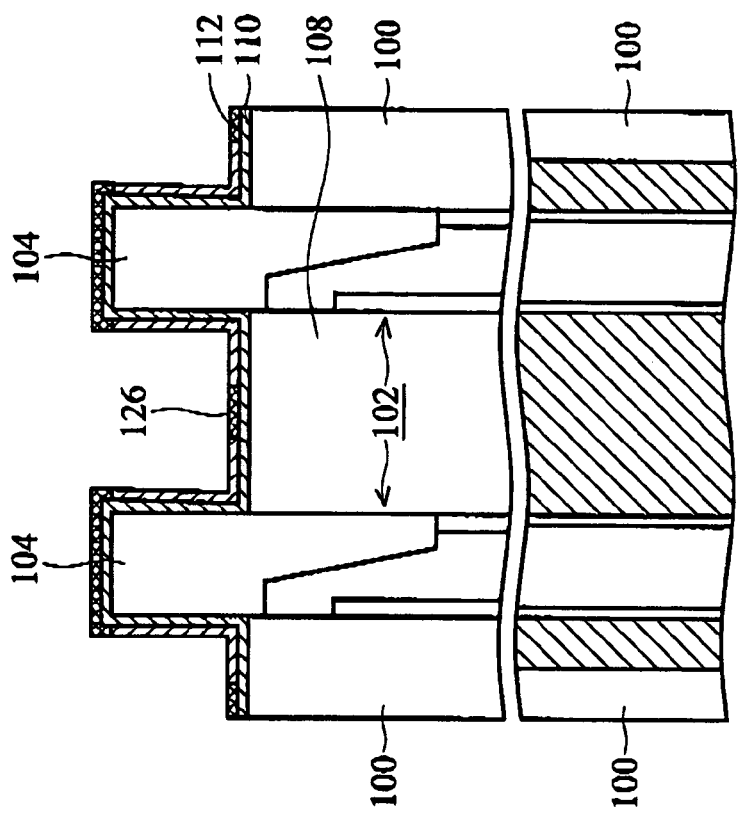
Figure 2G:
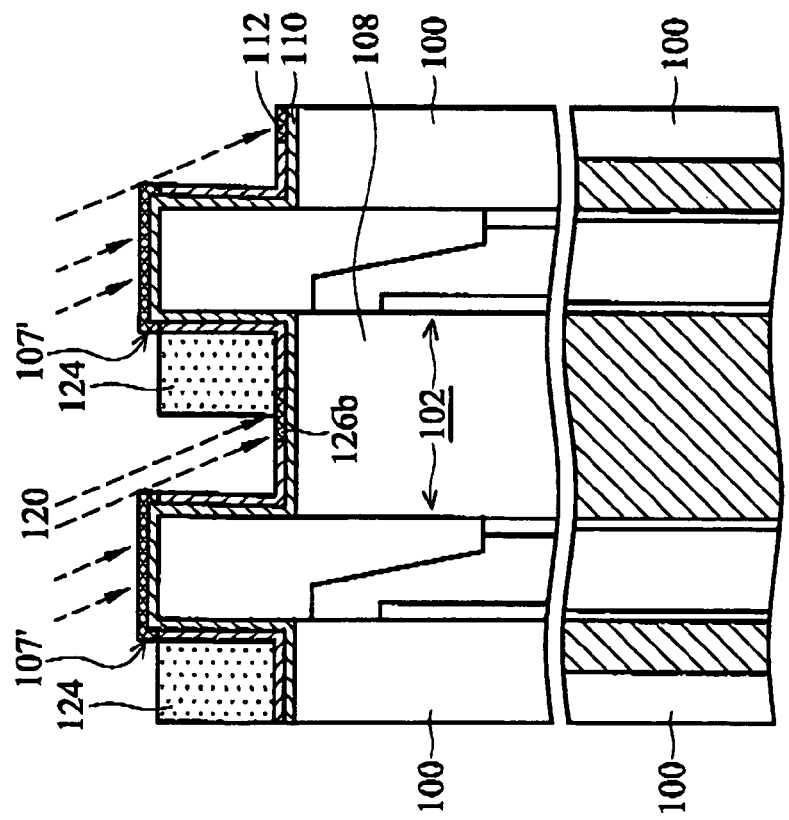

Referring to FIG. 2G, the second photoresist layer 122 is patterned to form a second implanting mask 124. The second implanting mask 124 is adjacent to the second side wall 107' of the protrusion structure 104, that is, on the other side of the predetermined area 108. Next, another portion of the second mask layer 112 is tilt-implanted 120 again with, such as $BF_2$, using the second implanting mask 124. Thus, a second implanted portion 126b is formed. The first and second implanted portions 126a and 126b define the location of the recess to be formed.

Figure 2I:
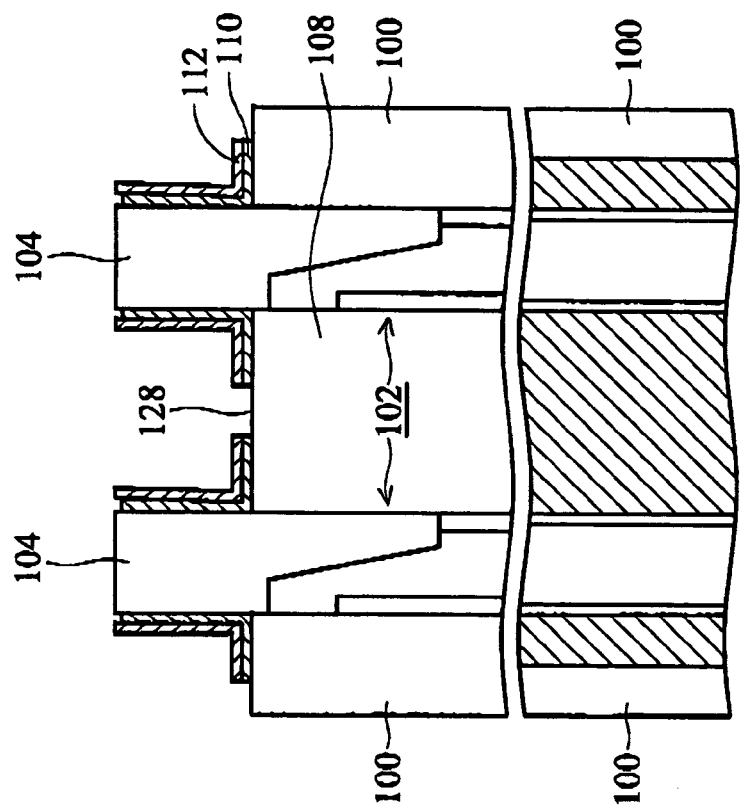

Referring to FIG. 2H, after removing the second implanting mask 124, the implanted portion 126 of the second mask layer 112 between the two trench capacitor devices 102 is exposed. All of the implanted portions of the second mask layer 112 are then removed, exposing the first mask layer 110 overlying the predetermined recess area, as shown in FIG. 2I.

Figure 2J:
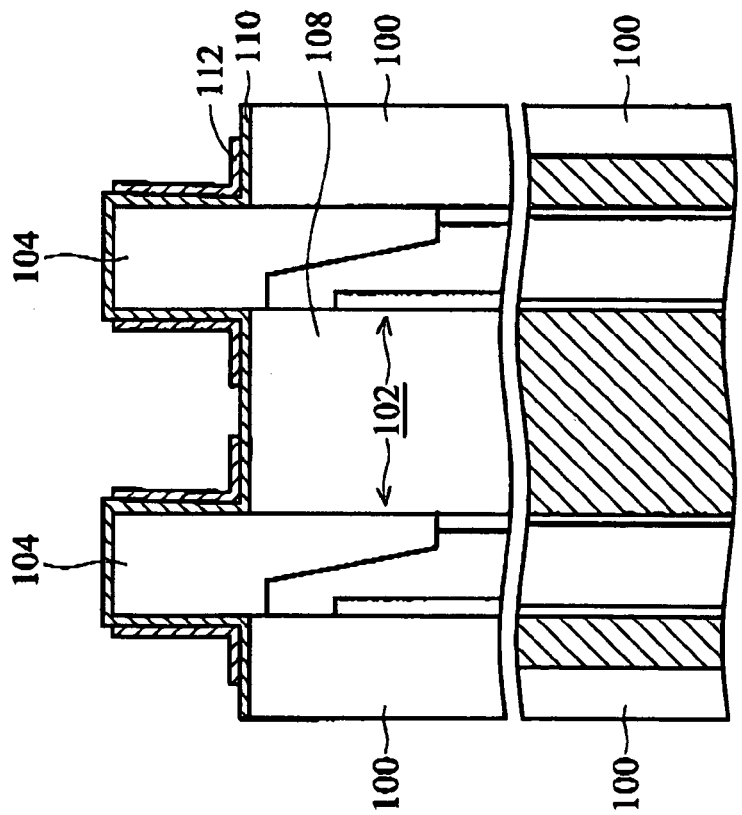

The first mask layer 110 uncovered by non-implanted second mask layer 112 is then removed to form a patterned mask layer, exposing a substrate area 128, as shown in FIG. 2J.

Figure 2K:
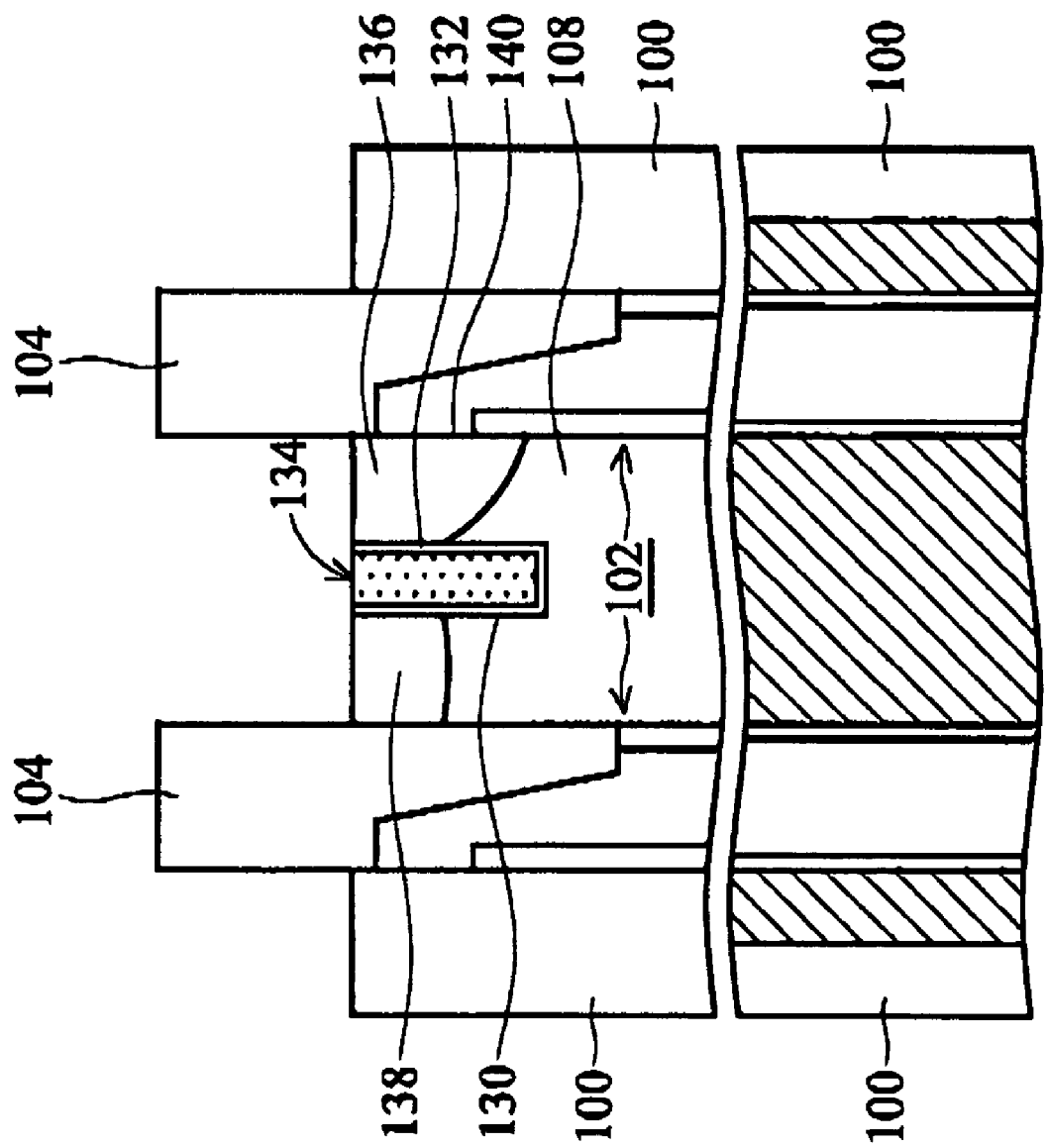

Referring to FIG. 2K, the exposed substrate area 128 is then etched using the patterned mask layer 112 between the two trench capacitor devices 102 to form a recess 130 in the predetermined area 108.

A gate oxide 132 and a recessed gate 134 are finally formed in the recess 130 and source/drain 136/138 is formed in the predetermined area 108 using methods known in the art.

The invention provides a precious self alignment method for forming a recessed gate between deep trenches by tilt-implanting using a photoresist layer as an implanting mask, avoiding overlay errors caused by photolithography. The method is simple and the distances between a recessed gate and deep trenches can be preciously controlled. Additionally, an out diffusion distance from a buried strap 140 to the recess gate 134 in trench DRAM is well controlled due to the precise recess formation.

Although the above embodiment is illustrated by a process for forming a recess in a memory cell, the invention is not limited thereto. One skilled in the art can appreciate that the invention may apply to any devices requiring a precise opening.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a recess, comprising:
   providing a substrate with two protrusions disposed above the substrate, wherein each protrusion comprises a first side wall and a second side wall opposite to the first side wall;
   conformally forming a mask layer on the substrate and the protrusions;
   tilt implanting the mask layer using a first implanting mask adjacent to the first side wall of the protrusions;
   removing implanted portions of the mask layer to form a patterned mask layer; and
   etching the substrate using the patterned mask layer, thereby forming a recess.

2. The method as claimed in claim 1, wherein the protrusions are single side buried strap isolations.

3. The method as claimed in claim 1, further comprising tilt implanting the mask layer using a second implanting mask adjacent to the second side wall of the protrusions.

4. The method as claimed in claim 1, wherein the mask layer comprises a first mask layer and a second mask layer overlying the first mask layer.

5. The method as claimed in claim 4, wherein the first mask layer is a silicon nitride layer.

6. The method as claimed in claim 4, wherein the second mask layer is a silicon oxide layer.

7. The method as claimed in claim 3, wherein the first and second implanting masks are photoresist layers.

8. The method as claimed in claim 1, wherein the mask layer is implanted with $BF_2$.

9. The method as claimed in claim 1, further comprising forming a recessed gate in the recess.

10. A method for forming a recess in fabrication of a memory cell, comprising:
    providing a substrate with two trench capacitor devices defining a predetermined area therebetween, wherein upper portions of the trench capacitor devices are revealed;
    conformally forming a mask layer on the substrate and the trench capacitor devices;
    forming a first implanting mask on one side of the predetermined area;
    tilt implanting the mask layer using the first implanting mask;
    removing implanted portions of the mask layer to form a patterned mask layer;
    etching the substrate using the patterned mask layer, thereby forming a recess in the predetermined area; and
    forming a recessed gate in the recess.

11. The method as claimed in claim 10, wherein the upper portion is a single side buried strap isolation of the trench capacitor device.

12. The method as claimed in claim 10, further comprising forming a second implanting mask on the other side of the predetermined area.

13. The method as claimed in claim 12, further comprising tilt implanting the mask layer using the second implanting mask.

14. The method as claimed in claim 10, wherein the mask layer comprises a first mask layer and a second mask layer overlying the first mask layer.

15. The method as claimed in claim 14, wherein the first mask layer is a silicon nitride layer.

16. The method as claimed in claim 14, wherein the second mask layer is a silicon oxide layer.

17. The method as claimed in claim 12, wherein the first and second implanting masks are photoresist layers.

18. The method as claimed in claim 10, wherein forming the first implanting mask comprises steps of:
    forming a first photoresist layer over the substrate and the trench capacitor devices;
    recessing the first photoresist layer to be level with or below top surfaces of the trench capacitor devices; and
    patterning the first photoresist layer to form a first implanting mask on one side of the predetermined area.

19. The method as claimed in claim 12, wherein forming the second implanting mask comprises steps of:
    forming a second photoresist layer over the substrate and the trench capacitor devices;
    recessing the second photoresist layer to be level with or below top surfaces of the trench capacitor devices; and
    patterning the second photoresist layer to form a second implanting mask on one side of the predetermined area.

20. The method as claimed in claim 10, wherein the mask layer is implanted with $BF_2$.

* * * * *